(12) United States Patent
Chai et al.

(10) Patent No.: US 10,938,344 B1
(45) Date of Patent: Mar. 2, 2021

(54) SYSTEMS AND METHODS FOR FREQUENCY-MODULATION

(71) Applicant: BESTECHNIC (SHANGHAI) CO., LTD., Shanghai (CN)

(72) Inventors: Lu Chai, Shanghai (CN); Wenyu Xiao, Shanghai (CN)

(73) Assignee: BESTECHNIC (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/942,732

(22) Filed: Jul. 29, 2020

(30) Foreign Application Priority Data

Apr. 28, 2020 (CN) .......................... 202010347169.X
Apr. 28, 2020 (CN) .......................... 202010347830.7

(51) Int. Cl.
*H03B 5/12* (2006.01)
*H03J 3/20* (2006.01)

(52) U.S. Cl.
CPC ......... *H03B 5/1215* (2013.01); *H03B 5/1228* (2013.01); *H03B 5/1243* (2013.01); *H03B 5/1293* (2013.01); *H03J 3/20* (2013.01); *H03J 2200/10* (2013.01)

(58) Field of Classification Search
CPC .. H03B 5/1215; H03B 5/1243; H03B 5/1293; H03B 5/1228; H03B 2200/10; H03J 3/20; H03J 2200/10

USPC ...... 331/117 FE, 177 V, 36 C, 167; 332/135, 332/136, 141
See application file for complete search history.

(56) References Cited

U.S. PATENT DOCUMENTS

| 8,436,689 B2 * | 5/2013 | Lee ...................... | H03B 5/1228 331/117 FE |
| 10,804,844 B2 * | 10/2020 | Brady .................. | H03B 5/1265 |
| 2012/0286889 A1 * | 11/2012 | Park ..................... | H03B 5/1212 331/117 FE |

FOREIGN PATENT DOCUMENTS

CN          101662260 a      3/2010

\* cited by examiner

*Primary Examiner* — Arnold M Kinkead
(74) *Attorney, Agent, or Firm* — Bayes PLLC

(57) ABSTRACT

Embodiments of oscillator circuits for wireless transmission of data are disclosed herein. In one example, an oscillator circuit includes an active network and a passive differential network coupled to the active network is disclosed. The active network is configured to generate an active signal for sustaining oscillation of the oscillator circuit. The passive network includes a first subnetwork, a second subnetwork, a first inductor and a second inductor. The first subnetwork is configured to adjust a central value of a resonant frequency of the oscillation. The passive network further includes a second subnetwork configured to further adjust the resonant frequency of the oscillation.

20 Claims, 8 Drawing Sheets

SYSTEMS AND METHODS FOR FREQUENCY-MODULATION

CROSS-REFERENCE TO RELATED APPLICATIONS

This application claims the benefits of priorities to Chinese Patent Application No. 202010347169.X, filed on Apr. 28, 2020 and Chinese Patent Application No. 202010347830.7, filed on Apr. 28, 2020, both of which are incorporated herein by reference in their entireties.

BACKGROUND

Embodiments of the present disclosure relate to systems and methods for frequency-modulation.

Frequency-modulation has been widely used in wireless communications such as Global System for Mobile Communications (GSM), the communications between user devices and wireless headphones for modulation and demodulation of data etc. As the modulation of the data in wireless communication become more and more complicated, the precision and resolution requirements of frequency-modulation for modulating data are getting higher and higher.

Conventional radio frequency (RF) modulation systems use voltage-controlled oscillator(s) (VCOs) including variable capacitor(s) (e.g., varactor diodes) and high precision digital-to-analog converter(s) (DACs) for providing frequency modulation to modulate data. Because of the system complexity, and the poor linearity, limited frequency adjusting rate, and low noise resistance performance caused by using the analog circuit (e.g., the analog circuit for performing the frequency control), conventional RF modulation systems have undesirable precision for modulating data to be transmitted (e.g., especially over 10 bit/second speed).

SUMMARY

Embodiments of systems and methods for frequency modulation with increased frequency-modulation resolution are disclosed herein.

In one example, an oscillator circuit is disclosed. The oscillator circuit includes an active network and a passive differential network coupled to the active network. The active network is configured to generate an active signal for sustaining oscillation of the oscillator circuit. The passive network includes a first inductor connected to the active network at a first end of the first inductor. The passive network also includes a first subnetwork coupled to the first end of the first inductor configured to adjust a central value of a resonant frequency of the oscillation. The passive network further includes a second subnetwork couple to a second end of the first indictor, opposite to the first end, configured to further adjust the resonant frequency of the oscillation. The passive network also includes a second inductor, connected in parallel with the second subnetwork at the second end of the first inductor, configured to improve a resolution of a frequency-modulation of the second subnetwork.

In another example, a radio frequency modulation system is disclosed. The radio frequency modulation system includes a capacitor array controller configured to generate a first control signal, a digital signal generator configured to generate a second control signal, an active network configured to generate an active signal for sustaining oscillation of the oscillator circuit and a passive network operatively coupled to the active network. The passive network includes a first inductor connected to the active network at a first end of the first inductor. The passive network also includes a first subnetwork coupled to the first end of the first inductor configured to adjust a central value of a resonant frequency of the oscillation based on the first control signal. The passive network further includes a second subnetwork couple to a second end of the first indictor, opposite to the first end, configured to further adjust the resonant frequency of the oscillation based on the second control signal. The passive network also includes a second inductor, connected in parallel with the second subnetwork at the second end of the first inductor, configured to improve a resolution of a frequency-modulation of the second subnetwork.

In still another example, a method for adjusting an oscillating signal is disclosed. The method includes generating, by an active network, an active signal for sustaining oscillation of an oscillator circuit. The method also includes adjusting, by a first subnetwork, a central value of a resonant frequency of the oscillation. The method further includes adjusting, by a second subnetwork, the resonant frequency of the oscillation around the central value of the resonant frequency. The first subnetwork is coupled to a first end of a first inductor and the second subnetwork is coupled to a second end of the first inductor, and the first inductor is connected to the active network at the first end.

This Summary is provided merely for purposes of illustrating some embodiments to provide an understanding of the subject matter described herein. Accordingly, the above-described features are merely examples and should not be construed to narrow the scope or spirit of the subject matter in this disclosure. Other features, aspects, and advantages of this disclosure will become apparent from the following Detailed Description, Figures, and Claims.

BRIEF DESCRIPTION OF THE DRAWINGS

The accompanying drawings, which are incorporated herein and form part of the specification, illustrate the presented disclosure and, together with the description, further serve to explain the principles of the disclosure and enable a person of skill in the relevant art(s) to make and use the disclosure.

Figure 1:
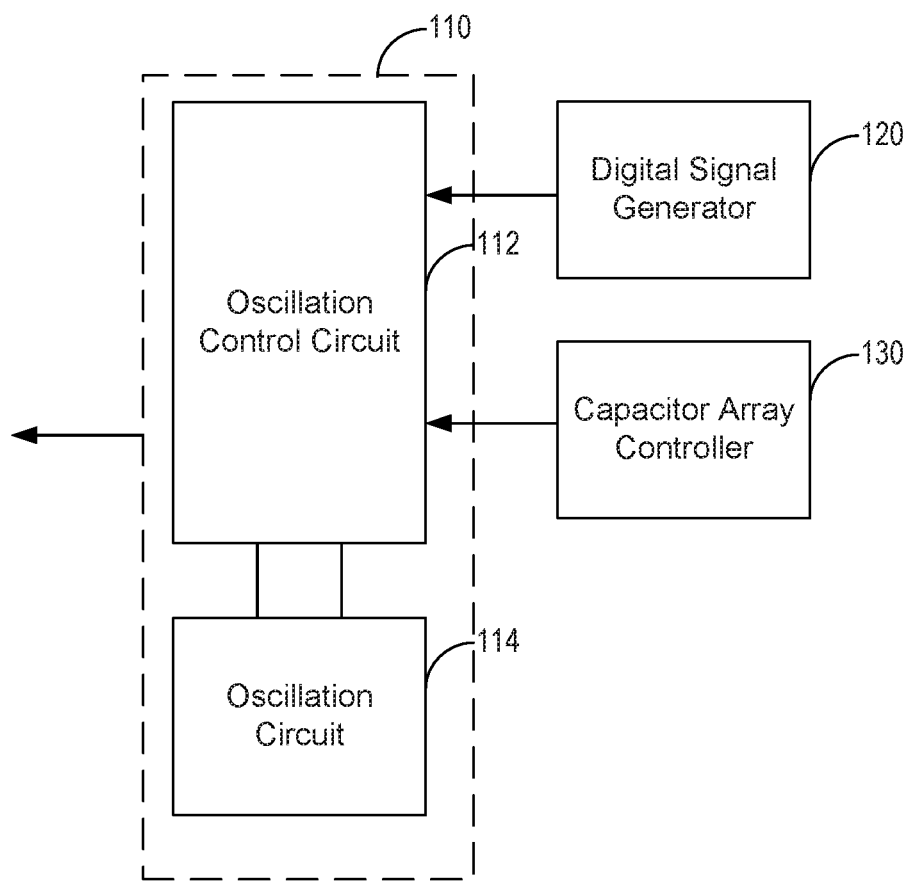
FIG. 1 is a block diagram illustrating an exemplary radio frequency-modulation system in accordance with some embodiments.

The presented disclosure is described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

Although specific configurations and arrangements are discussed, it should be understood that this is done for illustrative purposes only. It is contemplated that other configurations and arrangements can be used without departing from the spirit and scope of the present disclosure. It is further contemplated that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure, or characteristic is described in connection with an embodiment, it is contemplated that such feature, structure, or characteristic may also be used in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Frequency modulations are widely used in wireless communications such as Global System for Mobile Communications (GSM) and the communications between user devices and wireless headphones for modulation and demodulation of data. When transmitting data, baseband signals (e.g., from 1k Hz-100 MHz) are modulated to radio frequencies of about 1 MHz-100 GHz using the frequency modulation based on the oscillation of oscillator(s). As the modulation of the data in wireless communication become more and more complicated, oscillators of high precision and resolution for frequency-modulation are quite challenging.

Oscillators (e.g., the VCOs) provide frequency-modulation by oscillating at its' resonant frequencies. The resonant frequency of the oscillator depends on the capacitance and the inductance of the oscillator. By adjusting/modulating the capacitance of the oscillator, the resonant frequency of the oscillator can be adjusted/modulated (e.g., resonant frequency-modulation), thus the data can be modulated accordingly.

Conventional oscillators use variable capacitor(s) (e.g., varactor diodes) and high precision digital-to-analog converter(s) (DACs) for resonant frequency-modulation. Because of the system complexity, and the poor linearity, limited frequency adjusting rate, and low noise resistance performance caused by using the analog circuit (e.g., the analog circuit for performing the frequency-modulation control), conventional RF modulation systems have undesirable precision for modulating data to be transmitted (e.g., especially over 10 bit/second speed). Accordingly, digital controlled resonant frequency-modulation is used for frequency-modulation to modulate the data to be transmitted.

Conventional digital controlled resonant frequency-modulation schemes use a digital controlled capacitor array, connected in parallel with inductor(s) for oscillation. The schemes suffer from undesirable resonant frequency-modulation resolution (e.g., undesirable least significant bit (LSB) capacitance when adjusting the total capacitance of the oscillator). For example, when the frequency of the modulated signal is at about several GHz, the capacitance and the inductance of the oscillator are required to be small. For example, when the frequency of the modulated signal is about 2.4 GHz, the capacitance of the oscillation circuit is about 2.8 pF, and the inductance of the oscillation circuit is about 1.5 nH. If the variable capacitor (e.g., the effective capacitance of the capacitor array) changes 1 fF (e.g., being the LSB capacitance), the frequency of the modulated signal will change about 400 kHz which is about 167 ppm. This is far away from the requirement of about 10 ppm frequency-modulation resolution for complex modern wireless communications. To meet the 10 ppm frequency-modulation resolution requirement, the capacitance of the capacitor in the capacitor array has to be 0.05 fF. The manufacture of the capacitor with such a small capacitance is not achievable by current complementary metal-oxide-semiconductor (CMOS) manufacturing technologies.

As will be disclosed in detail below, among other novel features, an oscillator (e.g., a VCO) including a passive network for adjusting the resonant frequency of the oscillator using a cascade adjustment scheme is disclosed. In some embodiments, the passive network includes a first subnetwork for adjusting a central value of the resonant frequency of the oscillation (e.g., for coarse adjustments) and a second subnetwork for further adjusting the value of the resonant frequency (e.g., for fine adjustments).

In some embodiments, the first and the second subnetworks are connected to a first inductor at a first and second end, respectively. The first end of the first inductor is connected to an active network (e.g., including transistors) for generating an active signal for sustaining the oscillation. In some embodiments, the passive network further includes a second inductor connected in parallel with the second subnetwork at the second end of the first inductor, configured to improve the resolution of the frequency-modulation of the second subnetwork.

In some embodiments, the first subnetwork and the second subnetwork include a first variable capacitor and a second variable capacitor, respectively, configured to adjust the total capacitance of the first and the second subnetworks. For example, the first variable capacitor may be a capacitor array, controlled/adjusted by a capacitor array controller (e.g., sending control signals for controlling a number of the capacitors connected to the capacitor array). The second variable capacitor may be a digital controlled capacitor, controlled by a digital signal generator (e.g., sending control signals in a digital form for controlling the capacitance of the second variable capacitor).

In some embodiments, within each of the first and the second subnetwork, each of the first and the second variable capacitor may be connected in series with a first and a second fixed capacitor respectively to form a first and a second capacitor sub-unit for reducing the LSB capacitance of each subnetwork. This may further increase the resolution of the frequency-modulation of the first and the second subnetworks.

Because of the cascade adjustment scheme (e.g., using the first subnetwork for coarse adjustments and the second subnetwork for fine adjustments) and the reduced LSB capacitance of the first and the second subnetwork, the frequency-modulation resolution of the oscillator can be significantly increased (e.g., by 20 times compared to conventional VCO). And the precision of the frequency-modulation can be improved accordingly.

In some embodiments, to reduce the system error (e.g., noises caused by components of the system), the first and the second subnetworks may also be configured to work in a differential mode (e.g., generate differential signal outputs when oscillating). For example, the second subnetwork may include a third variable capacitor and a third fixed capacitor, being identical to the second variable capacitor and the second fixed capacitor, and be connected in series with the second variable capacitor and the second fixed capacitor. When working combinedly (e.g., connected/referenced to a local common where the control signals are input), the system error in both signals of the differential mode can cancel out each other and thus would minimize or eliminate common mode effects.

In some further embodiments, the passive network may have more than one subnetwork for finer adjustments (e.g., having a third and/or a fourth subnetwork with higher resolution etc.). For example, similar to the connection between the second subnetwork and the first subnetwork (e.g., through the first inductor), the third subnetwork can be connected to the second subnetwork through the second inductor, e.g., the second subnetwork and the third subnetwork being connected to a first end and a second end of the second inductor respectively. In some embodiments, for finer adjustments, the third subnetwork may have a higher frequency-modulation resolution (e.g., having a smaller LSB capacitance) than the first and the second subnetworks.

It is contemplated that being used for frequency modulation in wireless communication is only one application of the resonant frequency-modulation scheme disclosed herein. It is for illustrative purposes only and is not for limiting the application of the resonant frequency-modulation scheme. It is understood that the resonant frequency-modulation scheme disclosed herein can also be used for other purposes such as Global System for Mobile Communications (GSM), function generators, phase-locked loops (PLLs), music synthesizers, voltage-to-frequency converters, etc.

FIG. 1 is a block diagram illustrating an exemplary radio frequency modulation system in accordance with some embodiments. As illustrated in FIG. 1, radio frequency modulation system 100 can include an oscillator 110 (e.g., a VCO), a digital signal generator 120, and a capacitor array controller 130. In some embodiments, oscillator 110 may include an active network (e.g., an oscillation circuit 114) configured to generate an active signal for sustaining oscillation of oscillation circuit 114, and a passive network (e.g., an oscillation control circuit 112) for modulating the oscillation signals generated by oscillation circuit 114.

In some embodiments, oscillation circuit 114 may include transistor(s) (not shown) where control signals are input at a gate terminal of the transistor. In some embodiments, the transistor may be an N-type metal-oxide-semiconductor (NMOS), a P-type metal-oxide-semiconductor (PMOS), a complementary metal-oxide-semiconductor (CMOS) or any of the combination thereof. In some embodiments, oscillation control circuit 112 may include multiple subnetworks, separated by inductors (will be disclosed in detail below) for modulating/adjusting the oscillation signals generated by oscillation circuit 114. Each subnetwork may include at least one variable capacitor (e.g., a variable capacitor array) configured to adjust the total capacitance of oscillation control circuit 112 (e.g., by adjusting a total capacitance of the subnetwork). The inductor(s) and the capacitors (e.g., the variable and the fixed capacitors that will be disclosed below) may form an LC tank, configured to adjust a resonant frequency of oscillator 110.

In some embodiments, the variable capacitors in oscillation control circuit 112 may be controlled by digital signal generator 120 and/or capacitor array controller 130. Each of digital signal generator 120 and capacitor array controller 130 can generate digital bits for controlling the capacitance of the variable capacitances (e.g., for modulating the data to be transmitted). For example, FIG. 2 is a block diagram illustrating an exemplary digital signal generator 120 for controlling variable capacitors in oscillation control circuit 112 in accordance with various embodiments.

Figure 2:
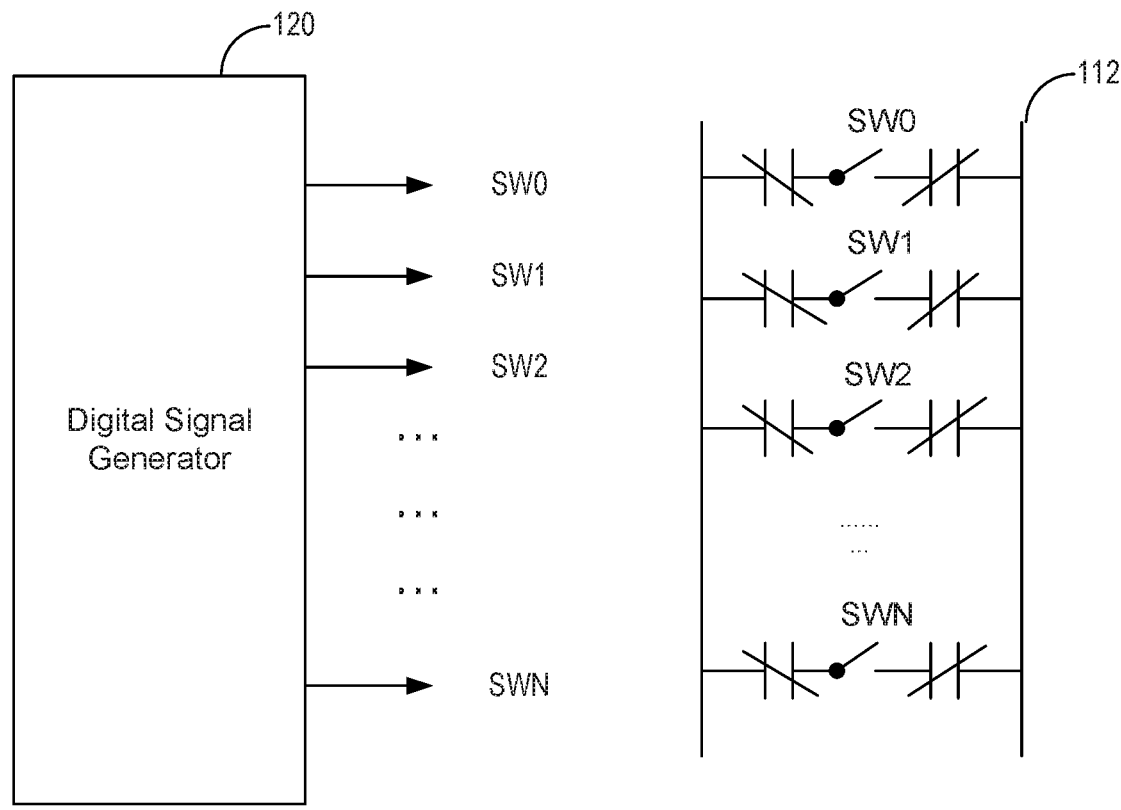
FIG. 2 is a block diagram illustrating an exemplary digital signal generator for controlling a variable capacitor in accordance with various embodiments.

As illustrated in FIG. 2, digital signal generator 120 may generate control signals (e.g., SW0, SW1, SW2 . . . SWN) in forms of, e.g., output alternating signals, direct signals, sinusoid signals, quadrature phase-shift keying (QPSK) signals, quadrature amplitude modulation (QAM) signals, etc. For example, the control signal generated by digital signal generator 120 may be in digital form (e.g., with a length of 1 bit, 2 bits, 3 bits, etc.). For example, if the control signal has a length of 3 bits, each of the control signal SW0, SW1, SW2 . . . or SWN may be one of 000, 001, 010, 011, 100, 101, 110, 111. Accordingly, 8 possible different control signals may be output to control oscillation control circuits 112 (components other than variable capacitors are not shown for illustrative purposes and for clarity). For example, the capacitance of each subnetwork may be controlled by adjusting the number of sub-capacitors connected to the subnetwork (e.g., the effective capacitance of the capacitor array) using switches controlled by the control signal (e.g., one of SW0, SW1, SW2 . . . or SWN).

Referring back to FIG. 1, in some embodiments, oscillation control circuit 112 may include a first subnetwork and a second subnetwork, configured to adjust a central value (i.e., coarse adjustments) of a resonant frequency of the oscillation and to further adjust (i.e., fine adjustments) the resonant frequency of the oscillation respectively. For example, the first subnetwork can be controlled by capacitor array controller 130, and the second subnetwork can be controlled by digital signal generator 120, as illustrated above. For example, when adjusting the central value of the resonant frequency of the oscillation, the total capacitance of oscillator 110 may be adjusted to be around a capacitance, calculated according to equation (1):

$$f = 1/\sqrt{L \times C} \quad (1),$$

where f is the central value of the resonant frequency of the oscillation to be adjusted to, and L is the total inductance of oscillation control circuit 112.

Based on the calculated total capacitance of oscillation control circuit 112, the capacitance of the first subnetwork may be determined, and be adjusted to accordingly (e.g., through adjusting the capacitance of the variable capacitor(s) in the first subnetwork controlled by the control signal generated by capacitor array controller 130).

In some embodiments, both the first and the second subnetworks may be controlled by oscillation control circuit 120 in the manner disclosed above. In some embodiments, the control signal generated for controlling the first subnetwork (e.g., for coarse adjustments) and the second subnetwork (e.g., for fine adjustments) may be generated based on the frequency of the signal to be transmitted. For example, the control signal generated for controlling the first subnetwork (e.g., for coarse adjustments) may be generated according to a baseband frequency of the signal to be transmitted, and the control signal generated for controlling the second subnetwork (e.g., for fine adjustments) may be generated according to the modulated frequency of the signal to be transmitted. The signal to be transmitted may be modulated based on wireless communication protocols BLUETOOTH protocols (e.g., BLUETOOTH classic), amended BLUETOOTH protocols (e.g., Low Energy (BLE), BLE audio, BLUETOOTH 5.2, etc.), Wi-Fi, Near-field Communication, etc, or cellular communications such as the 4th-generation (4G), Long Term Evolution (LTE), the 5th-generation (5G), New Radio (NR) etc.

By controlling/adjusting the capacitance of the variable capacitor in oscillation circuit 112 using control signals in digital bit form, the use of a digital-to-analog converter (DAC) can be avoided. This can reduce the noise introduced by the DAC and thus increase the modulation performance of radio frequency modulation system 100. Additionally, by reducing the use of the DAC, the size and the cost of radio frequency modulation system 100 can also be reduced.

FIGS. 3A-3E are circuit diagrams illustrating various exemplary VCO control circuits 112 in accordance with various embodiments. oscillation control circuit 112 may be configured to control/adjust a resonant frequency of oscillator 300A based on controlling/adjusting variable capacitors in subnetworks included for modulating the signal to be transmitted. In some embodiments, VCO control circuits 112 includes a first subnetwork 310A for adjusting a central value of the resonant frequency of the oscillation (e.g., for coarse adjustments) and a second subnetwork 320A for further adjusting the value of the resonant frequency (e.g., for fine adjustments). First subnetwork 310 and second subnetwork 320 may have variances circuit topologies (i.e., circuit designs as illustrated in FIGS. 3A-3E) for meeting different frequency-modulation performances.

Figure 3A:
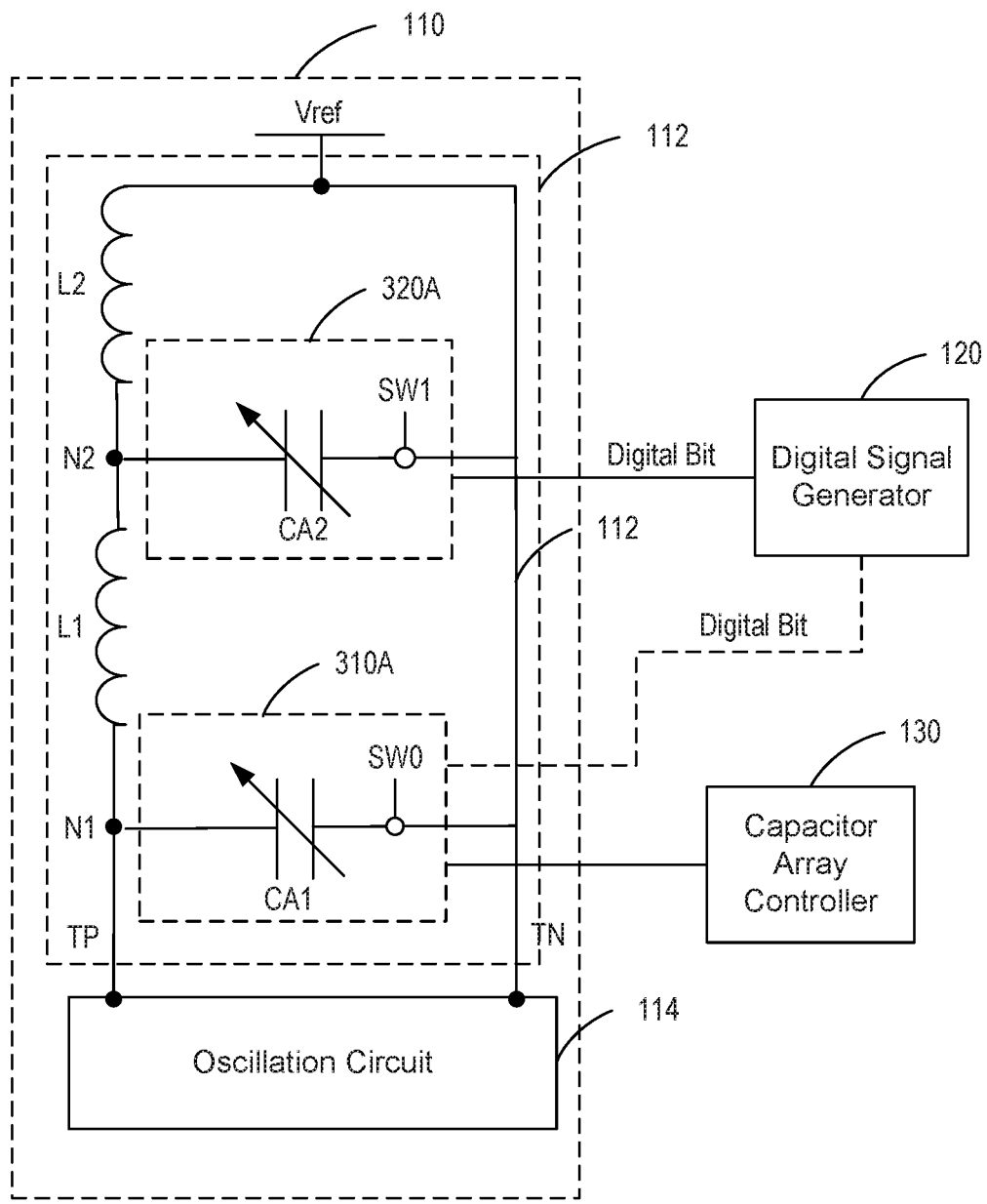
FIGS. 3A-3E are circuit diagrams illustrating various exemplary oscillators in accordance with various embodiments.

For example, as illustrated in FIG. 3A, oscillator 300A may include a passive network (VCO control circuits 112), configured to control/adjust a resonant frequency of oscillator 300A, and an active network (e.g., oscillation circuit 114) for generating an active signal for sustaining oscillation. In some embodiments, VCO control circuits 112 is electrically connected to oscillation circuit 114 at TP and TN. VCO control circuits 112 may include a first subnetwork 310A and a second subnetwork 320A, separated by a first inductor L1. In some embodiments, first subnetwork 310A is connected to a first end N1 of first inductor L1. Second subnetwork 320A is connected to a second end N2 of inductor L1, opposite to the first end N1. First end N1 of first inductor L1 is connected to oscillation circuit 114 at TP.

In some embodiments, first subnetwork 310A may include a variable capacitor CA1, configured to control/adjust a central value of the resonant frequency of the oscillation (e.g., for coarse adjustments) by adjusting a total capacitance of first subnetwork 310A. For example, in some embodiments, variable capacitor CA1 may include a capacitor array, controlled by control signals (e.g., control signals SW0) generated by capacitor array controller 130. The control signal may be configured to control the number of sub-capacitors connected to variable capacitor CA1 through switch(es) according to the value of the resonant frequency of the oscillation to be modulated to (e.g., a baseband frequency of the signal to be transmitted), similar to the mechanism disclosed in FIG. 2. In some other embodiments, variable capacitor CA1 may also be controlled by control signals generated by digital signal generator 120 according to the mechanism disclosed in FIG. 2.

In some embodiments, second subnetwork 320A may include a variable capacitor CA2, configured to further control/adjust the value of the resonant frequency of the oscillation (e.g., for fine adjustments) by adjusting a total capacitance of second subnetwork 320A. For example, in some embodiments, variable capacitor CA2 may include a capacitor array, controlled by control signals (e.g., control signals SW1) generated by capacitor array controller 130, according to the mechanism disclosed in FIG. 2.

In some embodiments, second subnetwork 320A may have a higher resolution for adjusting the resonant frequency of the oscillation than first subnetwork 310A. For example, variable capacitor CA2 may have a smaller LSB capacitance than variable capacitor CAL By using the cascade resonant frequency-modulation scheme, the resolution of the frequency-modulation can be improved, and thus the wireless communication using the modulation scheme may have higher precision in modulating the signal to be transmitted at a higher speed.

In some embodiments, VCO control circuits 112 may further include a second inductor L2, connected in parallel with second subnetwork 320A at the second end N2 of the first inductor L1, configured to further improve the resolution of the frequency-modulation of second subnetwork 320A. For example, a total capacitance of second subnetwork 320A may be calculated according to equation (2):

$$C'_2 = \left(\frac{L1}{L1+L2}\right)*C_2, \qquad (2)$$

where $C_2$ is the total capacitance of second subnetwork 320A and $C'_2$ is the equivalent capacitance of second subnetwork 320A when connected to VCO control circuits 112 at N2.

In this way, when the capacitance of variable capacitor CA2 changes $\Delta C_2$, the equivalent capacitance change in VCO control circuits 112 may be reduced proportionally. Thus, the resolution of the frequency-modulation of second subnetwork 320A can be increased. In some embodiments, the increment of the frequency-modulation resolution of second subnetwork 320A may be adjusted based on the ratio between the inductance of first inductor L1 and inductance of second inductor L2, according to the equation (2). In some embodiments, to realize the fine adjustment for second subnetwork 320A, the inductance of first inductor L1 is larger than the inductance of second inductor L2.

In some embodiments, to further improve the resolution of the frequency-modulation of second subnetwork 320A, second subnetwork 320A may further include a fixed capacitor connected in series with the variable capacitor CA2. For example, FIG. 3B is a circuit diagram illustrating another exemplary VCO control circuit 112 in accordance with various embodiments.

Figure 3B:
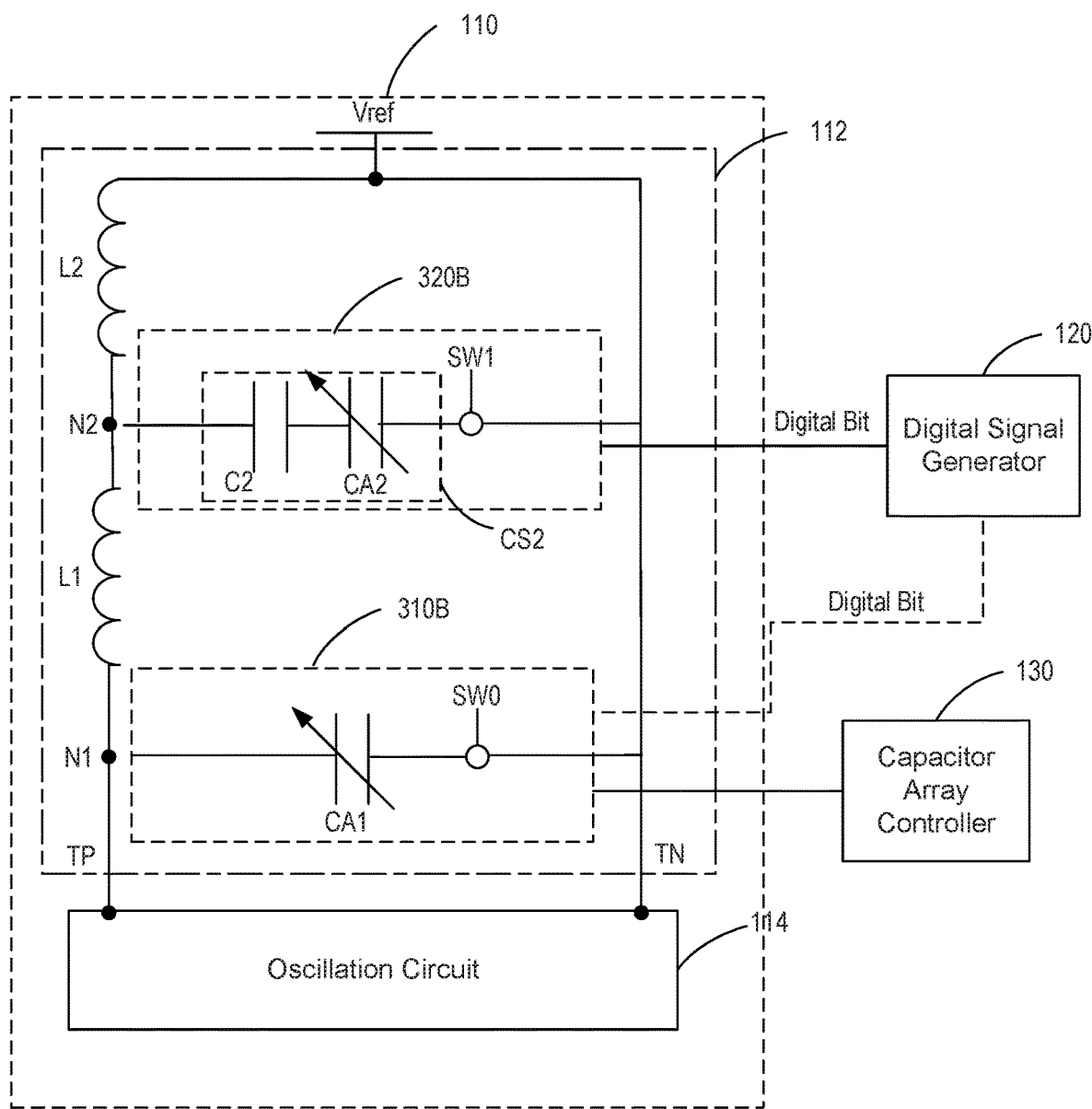

As illustrated in FIG. 3B, second subnetwork 320B may further include a second fixed capacitor C2 connected in series with second variable capacitor CA2. Accordingly, when second variable capacitor CA2 changes ΔCA2, an equivalent capacitor unit CS2 of second capacitor C2 and second variable capacitor CA2 for the frequency-modulation can be calculated according to equation (3):

$$\Delta CS2=((CA2+\Delta CA2) \times C2)/(CA2+C2+\Delta CA2) \approx (CA2 \times C2)/(CA2+C2)+C2/(CA2+C2)\Delta CA2 \qquad (3)$$

Accordingly, when controlled by the control signals generated by digital signal generator 120, the LSB capacitance of second subnetwork 320B, ΔCS2 can be further reduced. As a result, the resolution of the frequency-modulation of second subnetwork 320B can be further increased. In some embodiments, the increase of the resolution of the frequency-modulation of second subnetwork 320B can be adjusted based on adjusting the ratio between the capacitance of second fixed capacitor C2 and the capacitance of second variable capacitor CA2.

Similarly, in some embodiments, to further improve the resolution of the frequency-modulation of first subnetwork 310B, first subnetwork 310B may further include a first fixed capacitor connected in series with first variable capacitor CA1. For example, FIG. 3C is a circuit diagram illustrating another exemplary VCO control circuit 112 in accordance with various embodiments.

Figure 3C:
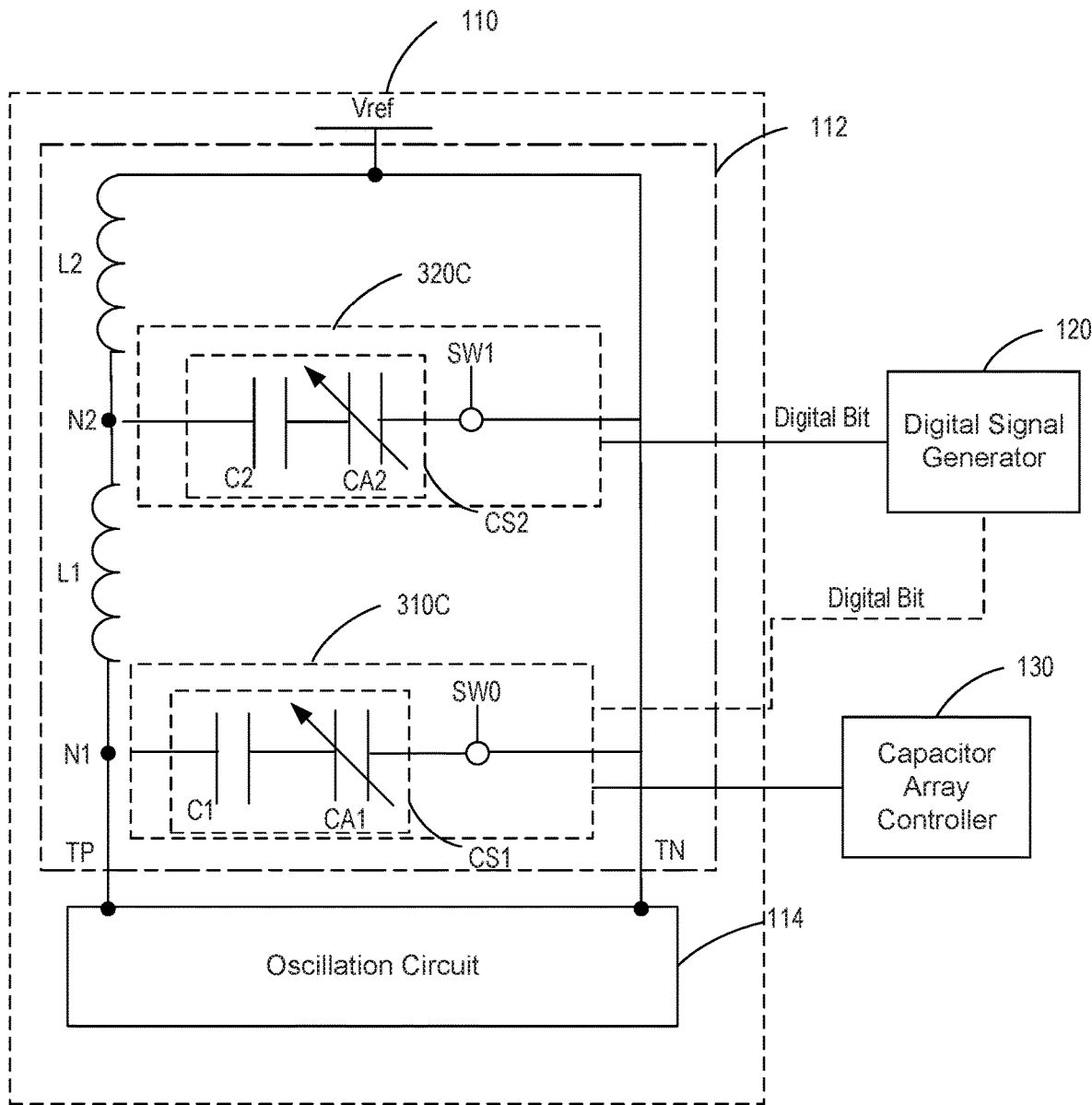

As illustrated in FIG. 3C, first subnetwork 310C may further include a first fixed capacitor C1 connected in series with first variable capacitor CA1. Accordingly, when first variable capacitor CA1 changes ΔCA1, an equivalent capacitor unit CS1 of first capacitor C1 and variable capacitor CA1 for the frequency-modulation can be calculated similarly to equation (3). Accordingly, the LSB capacitance of first subnetwork 310C, ΔCS1 can be further reduced, and thus the resolution of the frequency-modulation of first subnetwork 310C can be further increased. Similarly, in some embodiments, the increase of the resolution of the frequency-modulation of first subnetwork 310C can be adjusted based on adjusting the ratio between the capacitance of first fixed capacitor C1 and the capacitance of first variable capacitor CA1.

In some embodiments, to reduce the system error (e.g., noises caused by components of the system), first subnetwork 310C and second subnetwork 320C may also be configured to work in a differential mode (e.g., generate differential signal outputs when oscillating). For example, FIG. 3D is a circuit diagram illustrating another exemplary VCO control circuit 112 in accordance with various embodiments.

Figure 3D:
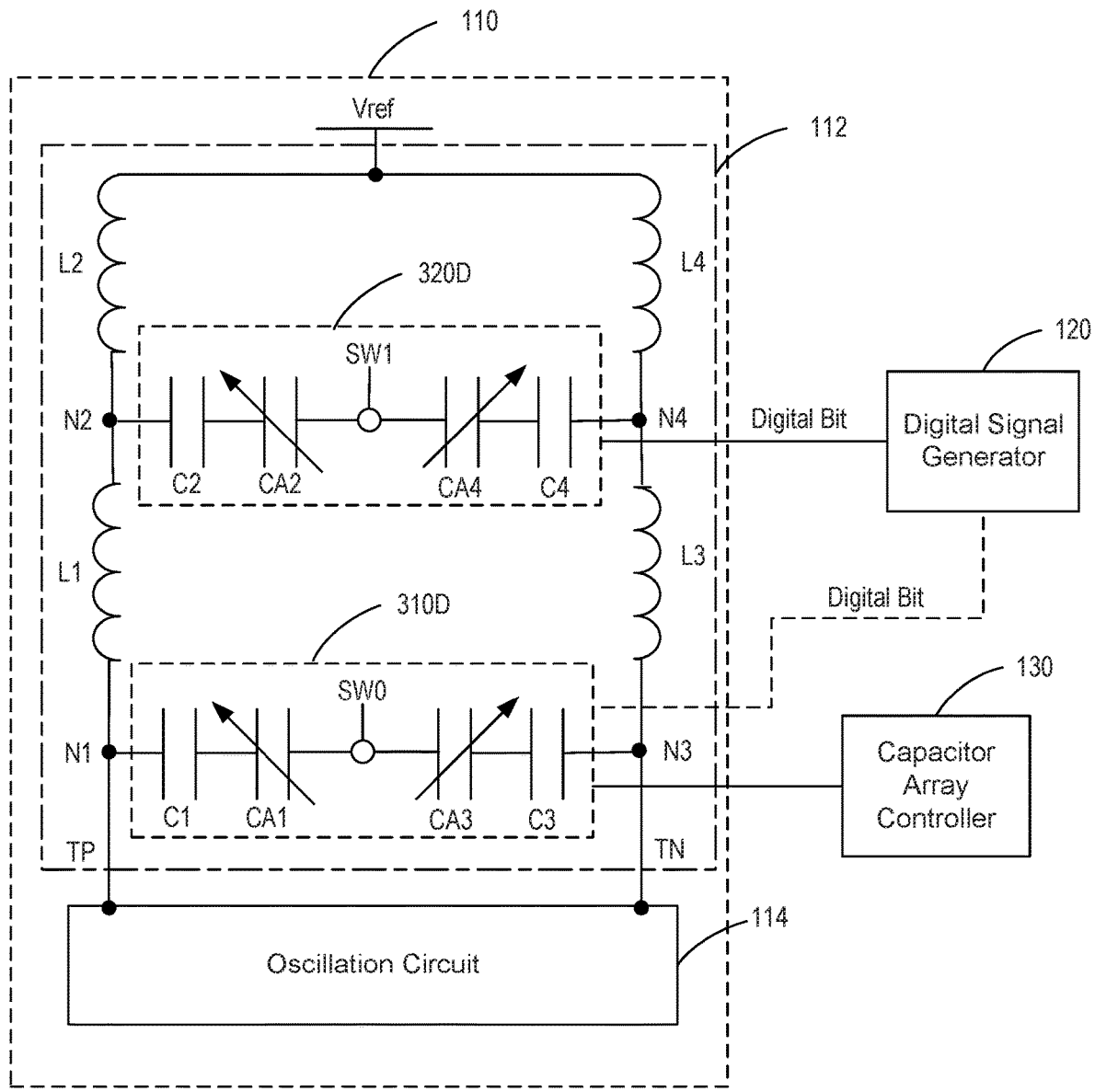

As illustrated in FIG. 3D, first subnetwork 310D may further include a third variable capacitor CA3 and a third fixed capacitor C3, being identical to first variable capacitor CA1 and first fixed capacitor C1, respectively. Third variable capacitor CA3 and third fixed capacitor C3 may be connected in series with first variable capacitor CA1 and first fixed capacitor C1. When working combinedly (e.g., connected/referenced to a local common, where the control signals SW0 are input), the system errors in first subnetwork 310D can be canceled out by each other (e.g., the differential signals of the differential mode) and thus would minimize or eliminate common mode effects.

Similarly, second subnetwork 320D may further include a fourth variable capacitor CA4 and a fourth fixed capacitor C4, being identical to second variable capacitor CA2 and second fixed capacitor C2, respectively. Fourth variable capacitor CA4 and fourth fixed capacitor C4 may be connected in series with second variable capacitor CA2 and second fixed capacitor C2.

For working in the differential mode, VCO control circuit 112 may further include a third inductor L3 and a fourth inductor L4, being identical to first inductor L1 and second inductor L2, respectively. For example, third inductor L3 may be connected to first subnetwork 310D and oscillation circuit 114 at a first end N3 (i.e., electrically equivalent to point TN), and connected to second subnetwork 320D at a second end N4, opposite to the first end N3. Fourth inductor L4 may be connected to second subnetwork 320D and third inductor L3 at the second end N4 and be connected to second inductor L2 at a local common Vref. In some embodiments, local common Vref can be of any voltage value between ground and the source voltage (e.g., the source voltage used for generating the oscillation).

Figure 3E:
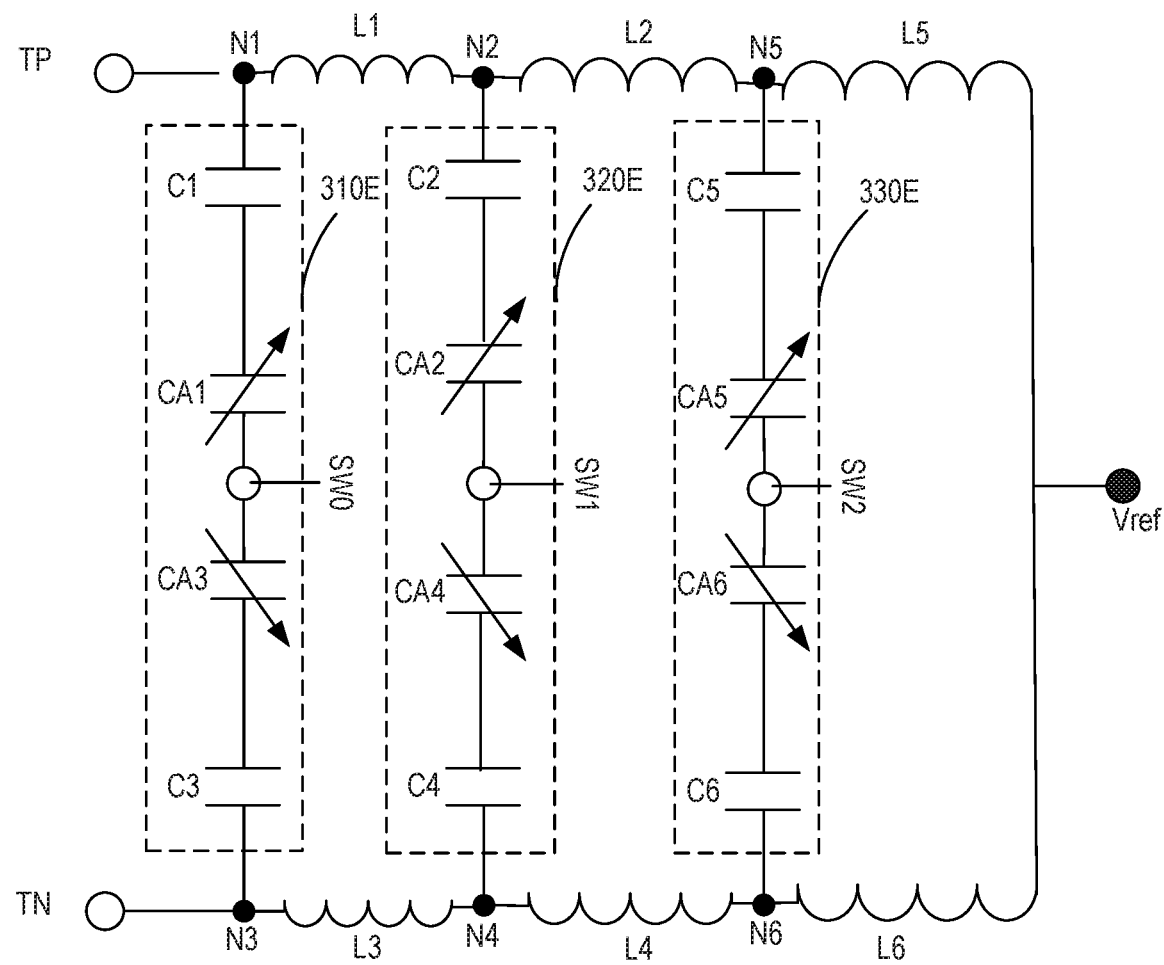

In some further embodiments, the passive network may have more subnetworks for finer adjustments (e.g., a third and/or fourth subnetwork with higher frequency-modulation resolution etc.). For example, FIG. 3E is a circuit diagram illustrating another exemplary VCO control circuit 112 with a third subnetwork 330E in accordance with various embodiments.

For example, similar to the connection of second network 320E, third subnetwork 330E can be connected to second network 320E at the second end N5 of second inductor L2 and the second end N6 of fourth inductor L4. In some embodiments, third subnetwork 330E may have a similar structure to second network 320E (e.g., two identical variable capacitors CA5 and CA6, and two identical fixed capacitors C5 and C6 connected in series) and may be controlled by another control signal generated by digital signal generator 120. In some embodiments, third subnetwork 330E may have a higher frequency-modulation resolution than first subnetwork 310E and second subnetwork 320E. For example, variable capacitors CA5 and CA6 in third subnetwork 330E may have a smaller LSB capacitance than variable capacitors CA1 and CA2 in first subnetwork 310E and variable capacitors CA3 and CA4 in second subnetwork 320E.

In some embodiments, VCO control circuit 112 may further include a fifth inductor L5 and a sixth inductor L6 connected to third subnetwork 330E, respectively, being identical to each other, for further adjusting the frequency-modulation resolution of third subnetwork 330E. For example, fifth inductor L5 may be connected to third subnetwork 330E at second end N5 of second inductor L2 and be connected to sixth inductor L6 at a local common Vref. In some embodiments, local common Vref can be of any voltage value between ground and the source voltage (e.g., the source voltage used for generating the oscillation). Sixth inductor L6 may be connected to third subnetwork 330E at a second end N6 of fourth inductor L4.

Because of the cascade adjustment scheme (e.g., using the first subnetwork for coarse adjustments and the second, third or more subnetworks for finer adjustments), and the reduced LSB capacitance of each variable capacitor in each subnetworks, the frequency-modulation resolution of the oscillator can be significantly increased (e.g., 20 times compared to conventional VCO). As a result, the precision of the frequency-modulation can be increased accordingly.

Figure 4:
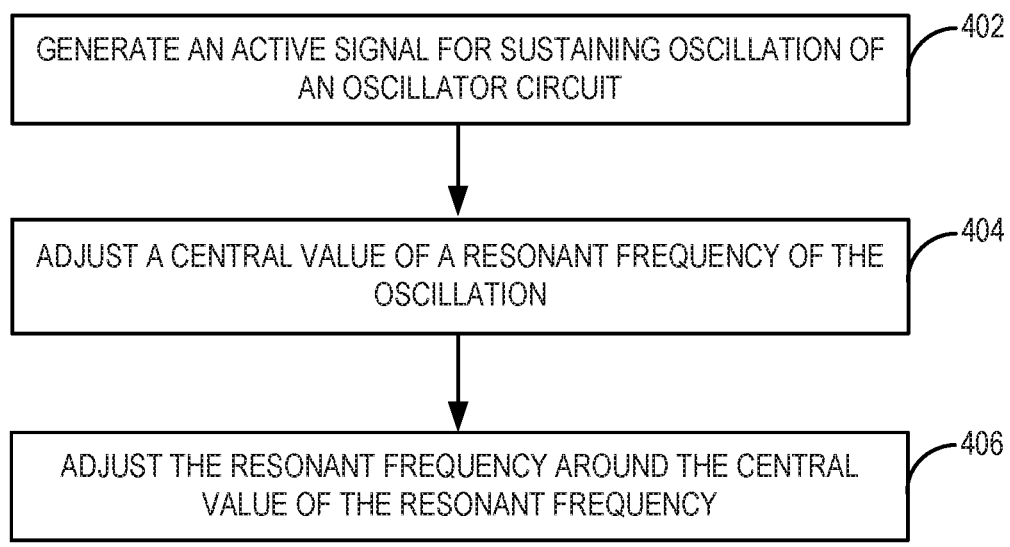
FIG. 4 is a flow chart illustrating an exemplary method for frequency modulation with increased frequency-modulation resolution in accordance with some embodiments.

FIG. 4 is a flow chart illustrating an exemplary method 400 for frequency modulation with increased frequency-modulation resolution in accordance with an embodiment. Method 400 can be performed by processing logic that can comprise hardware (e.g., circuitry, dedicated logic, programmable logic, microcode, etc.), software (e.g., instructions executed on a processing device), or a combination thereof. It is to be appreciated that not all operations may be needed to perform the disclosure provided herein. Further, some of the operations may be performed simultaneously, or in a different order than shown in FIG. 4, as will be understood by a person of ordinary skill in the art.

Method 400 shall be described with reference to FIGS. 1, 2, and 3A-3E. However, method 400 is not limited to that exemplary embodiment. In method 400, the frequency-modulation is conducted in a cascade adjustment scheme (e.g., using a first subnetwork for coarse adjustments and a second subnetwork for fine adjustments) and the reduced LSB capacitance of variable capacitors. Accordingly, the frequency-modulation resolution of the oscillator can be significantly increased (e.g., by 20 times compared to conventional VCO), and the precision of the frequency-modulation can be improved accordingly.

Starting at step 402, an active signal for sustaining the oscillation of an oscillator circuit may be generated by an active network (e.g., oscillation circuit 114). In some embodiments, the active network may include transistor(s) (not shown) where control signals are input at a gate terminal of the transistor. In some embodiments, the transistor may be an NMOS, a PMOS, a CMOS, or any of the combination thereof.

In step 404, a central value of a resonant frequency of the oscillation may be adjusted using a first subnetwork (e.g., first subnetwork 310) of a passive network (e.g., oscillation control circuit 112), connected the active network.

In step 406, the resonant frequency of the oscillation around the central value of the resonant frequency is further adjusted by a second subnetwork (e.g., second subnetwork 320) of the passive network, connected to the first subnetwork through a first inductor (e.g., the first subnetwork and the second subnetwork being connected to a first and a second end of the first inductor respectively).

In some embodiments, each subnetwork may include at least one variable capacitor (e.g., a variable capacitor array) configured to adjust the total capacitance of the oscillator circuit (e.g., by adjusting a total capacitance of the subnetwork). The inductor(s) and the capacitors (e.g., the variable and the fixed capacitors that will be disclosed below) may form an LC tank, configured to adjust a resonant frequency of the oscillator.

In some embodiments, the passive network further includes a second inductor (e.g., L2 as illustrated in FIG. 3A) connected in parallel with the second subnetwork at the second end of the first inductor, configured to improve the resolution of the frequency-modulation of the second subnetwork.

In some embodiments, each of the first and the second subnetwork includes a first and a second variable capacitors, respectively (e.g., first variable capacitor CA1 and second variable capacitor CA2 as illustrated in FIG. 3A), configured to adjust the total capacitance of the first and the second subnetworks. For example, the first variable capacitor may be a capacitor array, controlled/adjusted by a capacitor array controller (e.g., sending control signals for controlling a number of the capacitors connected to the capacitor array). The second variable capacitor may be a digital controlled capacitor, controlled by a digital signal generator (e.g., sending control signals in a digital form for controlling the capacitance of the second variable capacitor).

In some embodiments, within each of the first and the second subnetwork, each of the first and the second variable capacitor may be connected in series with a first and a second fixed capacitor respectively (e.g., first fixed capacitor C1 and second fixed capacitor C2 as illustrated in FIG. 3C) to form a first and a second capacitor sub-unit (e.g., sub-unit CS1 and sub-unit CS2 in FIG. 3C) for reducing the LSB capacitance of each subnetwork. This may further increase the resolution of the frequency-modulation of the first and the second subnetworks.

In some embodiments, to reduce the system error (e.g., noises caused by components of the system), the first and the second subnetworks may also be configured to work in a differential mode (e.g., generate differential signal outputs when oscillating). For example, the second subnetwork may include a third variable capacitor and a third fixed capacitor, being identical to the second variable capacitor and the second fixed capacitor, and be connected in series with the second variable capacitor and the second fixed capacitor (e.g., fourth variable capacitor C4 and fourth fixed capacitor C4 in FIG. 3D). When working combinedly (e.g., connected/referenced to a local common where the control signals are input), the system error in both signals of the differential mode can cancel out each other and thus would minimize or eliminate common mode effects.

In some further embodiments, the passive network may have more than one subnetwork for finer adjustments (e.g., having a third and/or a fourth subnetwork, with higher resolution, such as third subnetwork 330E illustrated in FIG. 3E). For example, similar to the connection between the second subnetwork and the first subnetwork (e.g., through the first inductor), the third subnetwork can be connected to the second subnetwork through the second inductor, e.g., the second subnetwork and the third subnetwork being connected to a first end and a second end of the second inductor respectively. In some embodiments, for finer adjustments, the third subnetwork may have a higher frequency-modulation resolution (e.g., having a smaller LSB capacitance) than the first and the second subnetworks.

Because of the cascade adjustment scheme (e.g., using the first subnetwork for coarse adjustments and the second subnetwork for fine adjustments) and the reduced LSB capacitance of the first and the second subnetwork, the frequency-modulation resolution of the oscillator can be significantly increased (e.g., by 20 times compared to conventional VCO). And the precision of the frequency-modulation can be improved accordingly. By introducing the differential mode, the system error generated while modulating the signal to be transmitted can also be reduced or eliminated.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure or the appended claims in any way.

While the present disclosure has been described herein with reference to exemplary embodiments for exemplary fields and applications, it should be understood that the present disclosure is not limited thereto. Other embodiments and modifications thereto are possible, and are within the scope and spirit of the present disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

The breadth and scope of the present disclosure should not be limited by any of the above-described exemplary embodiments, but should be defined only in accordance with the following claims and their equivalents.

What is claimed is:

1. An oscillator circuit, comprising:
   an active network configured to generate an active signal for sustaining oscillation of the oscillator circuit; and a passive network coupled to the active network, comprising:
- a first inductor connected to the active network at a first end of the first inductor;
- a first subnetwork coupled to the first end of the first inductor configured to adjust a central value of a resonant frequency of the oscillation, wherein the first subnetwork comprises:
  - a first variable capacitor configured to adjust a total capacitance of the first subnetwork; and
  - a first fixed capacitor connected in series with the first variable capacitor;
- a second subnetwork couple to a second end of the first inductor, opposite to the first end, configured to further adjust the resonant frequency of the oscillation, wherein the second subnetwork comprises a second variable capacitor configured to adjust a total capacitance of the second subnetwork; and
- a second inductor, connected in parallel with the second subnetwork at the second end of the first inductor, configured to improve a resolution of a frequency-modulation of the second subnetwork.

2. The oscillator circuit of claim 1, wherein the second subnetwork further comprises a second fixed capacitor connected in series with the second variable capacitor, configured to further increase the resolution of the frequency-modulation of the second subnetwork for further adjusting the resonant frequency of the oscillation.

3. The oscillator circuit of claim 2, wherein the second subnetwork further comprises a third fixed capacitor and a third variable capacitor connected in series with the second variable capacitor and the second fixed capacitor, configured to generate a differential signal output of the second subnetwork.

4. The oscillator circuit of claim 1, wherein an inductance of the first inductor is larger than an inductance of the second inductor.

5. The oscillator circuit of claim 1, wherein a total capacitance of the first subnetwork is controlled by a first control signal, and a total capacitance of the second subnetwork is controlled by a second control signal different from the first control signal.

6. The oscillator circuit of claim 5, wherein the second control signal is in digital bit form.

7. The oscillator circuit of claim 1, wherein the resolution of a frequency modulation of the second subnetwork for adjusting the resonant frequency of the oscillation is higher than a frequency-modulation resolution of the first subnetwork for adjusting the resonant frequency of the oscillation.

8. A system for radio frequency modulation, comprising:
- a capacitor array controller configured to generate a first control signal;
- a digital signal generator configured to generate a second control signal;
- an active network configured to generate an active signal for sustaining oscillation of the frequency modulation; and
- a passive network coupled to the active network, comprising:
  - a first inductor connected to the active network at a first end of the first inductor;
  - a first subnetwork coupled to the first end of the first inductor configured to adjust a central value of a resonant frequency of the oscillation based on the first control signal wherein the first subnetwork comprises:
    - a first variable capacitor configured to adjust a total capacitance of the first subnetwork; and
    - a first fixed capacitor connected in series with the first variable capacitor;
  - a second subnetwork couple to a second end of the first indictor inductor, opposite to the first end, configured to further adjust the resonant frequency of the oscillation based on the second control signal, wherein the second subnetwork comprises:
    - a second variable capacitor configured to adjust a total capacitance of the second subnetwork; and
    - a second fixed capacitor connected in series with the second variable capacitor; and
  - a second inductor, connected in parallel with the second subnetwork at the second end of the first inductor, configured to improve a resolution of a frequency-modulation of the second subnetwork.

9. The system of claim 8, wherein the second subnetwork further comprises a third fixed capacitor and a third variable capacitor connected in series with the second variable capacitor and the second fixed capacitor, configured to generate a differential signal output of the second subnetwork.

10. The system of claim 8, wherein an inductance of the first inductor is larger than an inductance of the second inductor.

11. The system of claim 8, wherein a total capacitance of the first subnetwork is controlled by a first control signal, and a total capacitance of the second subnetwork is controlled by a second control signal, different from the first control signal.

12. A method for modulating an oscillating signal, comprising:
- generating, by an active network, an active signal for sustaining oscillation of an oscillator circuit; and
- adjusting, by a first subnetwork, a central value of a resonant frequency of the oscillation, wherein the first subnetwork comprises:
  - a first variable capacitor configured to adjust a total capacitance of the first subnetwork; and
  - a first fixed capacitor connected in series with the first variable capacitor; and
- adjusting, by a second subnetwork, the resonant frequency of the oscillation around the central value of the resonant frequency, wherein the second subnetwork comprises a second variable capacitor configured to adjust a total capacitance of the second subnetwork, wherein the first subnetwork is coupled to a first end of a first inductor and the second subnetwork is coupled to a second end of the first inductor, and wherein the first inductor is connected to the active network at the first end.

13. The method of claim 12, further comprises a second inductor, connected in parallel with the second subnetwork at the second end of the first inductor, configured to improve a resolution of a frequency-modulation of the second subnetwork.

14. The oscillator circuit of claim 3, wherein the third variable capacitor and the third fixed capacitor are identical to the second variable capacitor and the second fixed capacitor, respectively.

15. The oscillator circuit of claim 14, wherein the first subnetwork further comprises a fourth variable capacitor and a fourth fixed capacitor connected in series with the first variable capacitor and the first fixed capacitor, wherein the fourth variable capacitor and the fourth fixed capacitor are identical to first variable capacitor and first fixed capacitor respectively.

16. The system of claim 9, wherein the third variable capacitor and the third fixed capacitor are identical to the second variable capacitor and the second fixed capacitor, respectively.

17. The system of claim 16, wherein the first subnetwork further comprises a fourth variable capacitor and a fourth fixed capacitor connected in series with the first variable capacitor and the first fixed capacitor, wherein the fourth variable capacitor and the fourth fixed capacitor are identical to the first variable capacitor and the first fixed capacitor, respectively.

18. The system of claim 11, wherein the second control signal is in a digital bit form.

19. The method of claim 12, wherein the second subnetwork further comprises a second fixed capacitor connected in series with the second variable capacitor.

20. The method of claim 19, wherein the second subnetwork further comprises a third variable capacitor and a third fixed capacitor connected in series with the second variable capacitor and the second fixed capacitor, wherein the third variable capacitor and the third fixed capacitor are identical to the second variable capacitor and the second fixed capacitor, respectively.

* * * * *